(12) United States Patent
Park et al.

(10) Patent No.: US 12,254,371 B2
(45) Date of Patent: Mar. 18, 2025

(54) SMART TRACKER

(71) Applicant: AMOSENSE CO., LTD., Cheonan-si (KR)

(72) Inventors: Hyunjoo Park, Cheonan-si (KR); Hyungil Baek, Cheonan-si (KR); Kyunghyun Ryu, Cheonan-si (KR); Seho Lee, Cheonan-si (KR); Jaeil Park, Cheonan-si (KR); Seungyeob Yi, Cheonan-si (KR); Jungryul Kim, Cheonan-si (KR); Jeonggeun Heo, Cheonan-si (KR)

(73) Assignee: AMOSENSE CO., LTD., Cheonan-si (KR)

( * ) Notice: Subject to any disclaimer, the term of this patent is extended or adjusted under 35 U.S.C. 154(b) by 0 days.

(21) Appl. No.: 18/039,176

(22) PCT Filed: Nov. 30, 2021

(86) PCT No.: PCT/KR2021/017817
§ 371 (c)(1),
(2) Date: May 26, 2023

(87) PCT Pub. No.: WO2022/114911
PCT Pub. Date: Jun. 2, 2022

(65) Prior Publication Data
US 2024/0296307 A1    Sep. 5, 2024

(30) Foreign Application Priority Data

Nov. 30, 2020 (KR) .................. 10-2020-0163865

(51) Int. Cl.
*G06K 19/077* (2006.01)
*G08B 3/10* (2006.01)
*H05K 7/14* (2006.01)

(52) U.S. Cl.
CPC ........ *G06K 19/07773* (2013.01); *G08B 3/10* (2013.01); *H05K 7/1427* (2013.01)

(58) Field of Classification Search
CPC ....... G06K 19/07773; G06K 19/07758; G08B 3/10; G08B 13/14; G08B 21/02;
(Continued)

(56) References Cited

U.S. PATENT DOCUMENTS 9,466,194 B1 * 10/2016 Kraz .................. G08B 3/10
11,043,086 B1 * 6/2021 Daoura .............. G08B 21/24
(Continued)

FOREIGN PATENT DOCUMENTS

KR    10-2011-0120497 A    11/2011
KR    1020120072191 A  *  7/2012
(Continued)

*Primary Examiner* — Adnan Aziz
(74) *Attorney, Agent, or Firm* — Maschoff Brennan

(57) ABSTRACT

Disclosed is a smart tracker for communicating with a parent terminal by Bluetooth communication and communicating with the parent terminal by ultra-wideband communication during positioning. The disclosed smart tracker comprises: a first housing; a second housing coupled to the first housing to form an inner space; a circuit board arranged in the inner space formed by the first housing and the second housing; a buzzer mounted on the lower surface of the circuit board; a battery mounted on a surface of the circuit board; a first antenna arranged on the upper surface of the circuit board and spaced from the areas on which the buzzer and the battery are mounted; and a second antenna arranged on the upper surface of the circuit board and spaced from the areas on which the buzzer and the battery are mounted and from the first antenna.

6 Claims, 5 Drawing Sheets

(58) Field of Classification Search
CPC .. G08B 21/24; G08B 21/0277; H05K 7/1427; H01Q 1/24; H01Q 1/38; H01Q 1/243; H04W 4/029

See application file for complete search history.

(56) References Cited

U.S. PATENT DOCUMENTS

| | | | | |
|---|---|---|---|---|
| 11,210,915 B2* | 12/2021 | Yang | ............... | G08B 13/2434 |
| 11,704,529 B2* | 7/2023 | Samardzija | ............... | H01Q 1/44 |
| | | | | 340/572.8 |
| 2014/0009355 A1* | 1/2014 | Samardzija | ............... | H01Q 9/0407 |
| | | | | 343/789 |
| 2015/0356393 A1* | 12/2015 | Daoura | ............... | H04L 67/10 |
| | | | | 340/8.1 |
| 2015/0359127 A1* | 12/2015 | Daoura | ............... | G08B 21/24 |
| | | | | 361/752 |
| 2016/0056526 A1* | 2/2016 | Li | ............... | H01Q 9/42 |
| | | | | 343/702 |
| 2017/0093019 A1* | 3/2017 | Toh | ............... | H01Q 9/0407 |
| 2017/0103297 A1 | 4/2017 | Daoura et al. | | |
| 2019/0019076 A1* | 1/2019 | Daoura | ............... | H04L 67/10 |
| 2019/0051980 A1 | 2/2019 | Ahn et al. | | |
| 2019/0280375 A1* | 9/2019 | Ahn | ............... | H01Q 1/38 |
| 2020/0337162 A1* | 10/2020 | Perkins | ............... | G04G 17/04 |
| 2021/0035429 A1* | 2/2021 | Daoura | ............... | H04W 4/80 |
| 2021/0135712 A1 | 5/2021 | Hong et al. | | |
| 2022/0004837 A1* | 1/2022 | Perkins | ............... | H04B 5/79 |
| 2022/0006892 A1* | 1/2022 | Perkins | ............... | A61B 5/4561 |
| 2022/0085487 A1* | 3/2022 | Wei | ............... | H01Q 1/38 |

FOREIGN PATENT DOCUMENTS

| | | |
|---|---|---|
| KR | 10-2019-0016251 A | 2/2019 |
| KR | 10-2019-0120639 A | 10/2019 |

* cited by examiner

SMART TRACKER

TECHNICAL FIELD

The present disclosure relates to a smart tracker that is used to track a position of an object.

BACKGROUND ART

As losing a small object, such as a cellular phone, a key, or a wallet, or a pet occurs frequently, various technologies have been developed to prevent such losing.

As an example, a method using a wireless transceiver is a method in which a wireless receiver is mounted on an object, and if a user operates a wireless transmitter to find the object, the wireless receiver generates an alarm to notify of the position of the object.

As another example, a Bluetooth type smart tracker is produced in the shape of a card or a ring, and is mounted on a wallet or an object, and if the object is spaced apart from a portable terminal of a user over a predetermined distance, the smart tracker generates an alarm to prevent the user from being spaced apart from the object over the predetermined distance.

Recently, in order to grasp the position of an object while preventing a loss of the object, various types of smart trackers have been developed and gradually miniaturized in a trend in order to facilitate the mounting on the object.

However, the smart tracker has the problems in that a battery capacity is reduced due to the miniaturization, and the power consumption is high due to a Bluetooth antenna, resulting in a short use time of the smart tracker.

SUMMARY OF INVENTION

Technical Problem

The present disclosure has been proposed to solve the above problems, and an object of the present disclosure is to provide a smart tracker, which communicates with a parent terminal in a Bluetooth communication method, and communicates with the parent terminal in an ultra-wideband communication method in case of positioning.

Further, another object of the present disclosure is to provide a smart tracker, which minimizes an interference between a first antenna and a second antenna by mounting the first antenna adjacent to a first corner of a circuit board and mounting the second antenna adjacent to a second corner of a circuit board facing the first corner in a diagonal direction.

Solution to Problem

In order to achieve the above objects, a smart tracker according to an embodiment of the present disclosure includes: a first housing; a second housing combined with the first housing to form an inner space; a circuit board disposed in the inner space formed by the first housing and the second housing; a buzzer mounted on a lower surface of the circuit board; a battery mounted on a surface of the circuit board; a first antenna disposed on an upper surface of the circuit board and spaced apart from an area on which the buzzer and the battery are mounted; and a second antenna disposed on the upper surface of the circuit board and spaced apart from the area on which the buzzer and the battery are mounted and the first antenna.

The circuit board may have a first corner and a second corner opposite to the first corner, and the first antenna may be disposed adjacent to the first corner on the upper surface of the circuit board and the second antenna may be disposed adjacent to the second corner on the upper surface of the circuit board.

The circuit board may include a first side, a second side facing the first side, a third side connected to one end part of the first side and one end part of the second side, and a fourth side connected to the other end part of the first side and the other end part of the second side and facing the third side, and the first antenna may be disposed adjacent to the first side and the second side and the second antenna may be disposed adjacent to the third side and the fourth side.

The buzzer may include a stepped part formed on one surface facing the lower surface of the circuit board, and the lower surface of the circuit board and the stepped part of the buzzer may form an accommodation space, and at least a part of the battery may be accommodated in the accommodation space.

The smart tracker according to an embodiment of the present disclosure may further include: a first signal processing element disposed on the upper surface of the circuit board to process a first signal received from the first antenna, and spaced apart from the area on which the buzzer and the battery are mounted, the first antenna, and the second antenna; and a second signal processing element disposed on the upper surface of the circuit board to process a second signal received from the second antenna, and spaced apart from the area on which the buzzer and the battery are mounted, the first antenna, the second antenna, and the first signal processing element.

The smart tracker according to an embodiment of the present disclosure may further include a control element mounted on the circuit board, wherein the control element may communicate with a parent terminal through the first antenna, and wherein the control element may activate the second antenna in response to a positioning request from the parent terminal, having been received through the first antenna, and deactivate the second antenna in response to a positioning termination request from the parent terminal.

Here, the first antenna may resonate with a frequency of a Bluetooth communication band, and the second antenna may resonate with a frequency of a UWB communication band.

ADVANTAGEOUS EFFECTS OF INVENTION

According to the present disclosure, the smart tracker has the effects of minimizing the power usage while heightening the positioning precision, and thus increasing the usage time in case of using the same battery as that of the smart tracker in the related art being composed of only the UWB antenna, by deactivating (in sleep mode) the UWB antenna in case of the normal communication with a parent terminal and activating (waking up) the UWB antenna in case of the positioning.

Further, the smart tracker has the effects of increasing the usage time and preventing the precision of the positioning from being deteriorated by blocking the signal interference between the two antennas through disposition of the UWB antenna as far away as possible from the Bluetooth antenna.

Further, the smart tracker has the effects of minimizing the mounting area of the buzzer and the battery and thus securing the mounting space of the antennas even in the miniaturized smart tracker by forming the accommodation space between the stepped part of the buzzer and the circuit board and inserting a part of the battery into the accommodation space.

Further, the smart tracker has the effects of minimizing the signal interference caused by the battery and the buzzer and thus minimizing the deterioration of the antenna performance by mounting the Bluetooth antenna and the UWB antenna so as not to overlap the buzzer and the battery.

DESCRIPTION OF EMBODIMENTS

Figure 1:
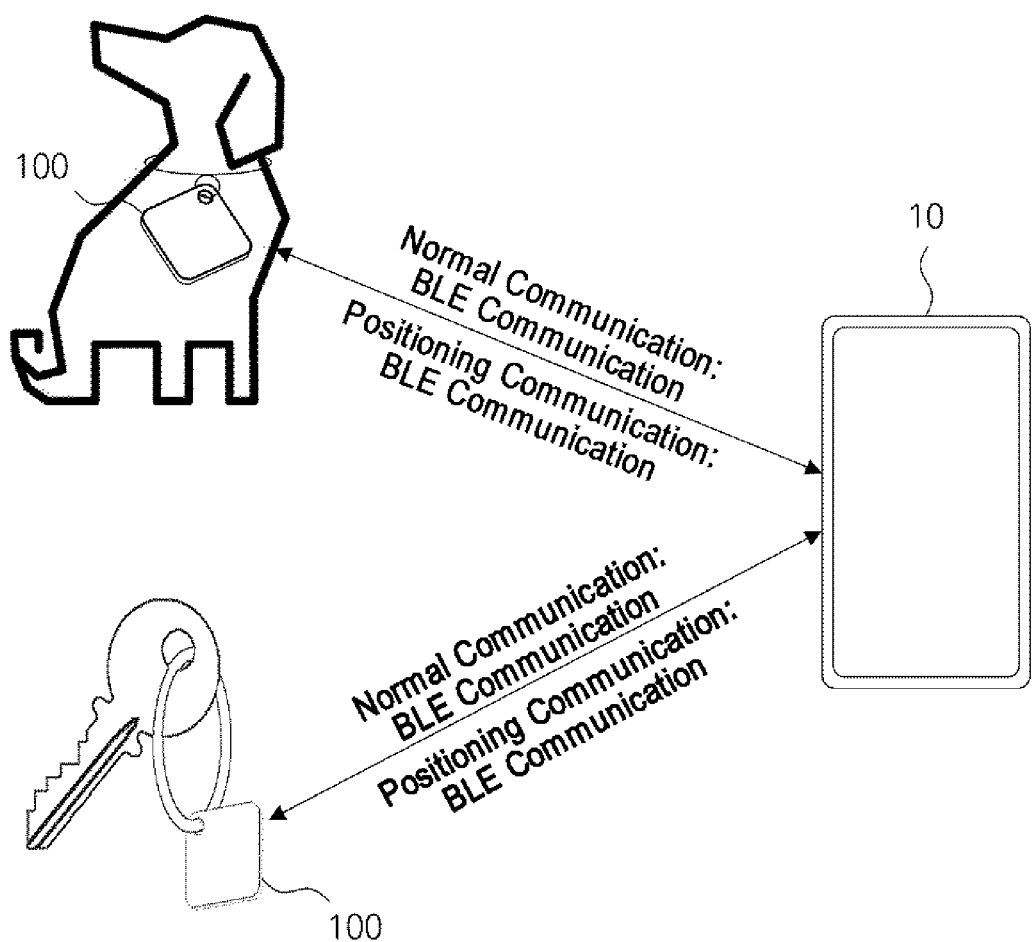
FIG. 1 is a diagram explaining a smart tracker according to an embodiment of the present disclosure.

For detailed explanation to the extent that those of ordinary skill in the art to which the present disclosure pertains can easily embody the technical idea of the present disclosure, the most preferred embodiment of the present disclosure will be described with reference to the accompanying drawings. First, in giving reference numerals to constituent elements of the respective drawings, it is to be noted that the same constituent elements have possibly the same reference numerals although they are denoted in different drawings. Further, in describing the present disclosure, detailed explanation of related known constitutions or functions will be omitted in case that such detailed explanation may obscure the subject matter of the present disclosure.

Referring to FIG. 1, a smart tracker 100 according to an embodiment of the present disclosure is mounted on an object, and communicates with a parent terminal 10.

In case of a normal communication except positioning, the smart tracker 100 communicates with the parent terminal 10 through a first antenna (i.e., BLE antenna) 140 that transmits/receives a signal of a first frequency band (i.e., Bluetooth frequency band of about 2.5 GHz).

In case of a positioning request from the parent terminal 10, the smart tracker 100 communicates with the parent terminal 10 through a second antenna (i.e., UWB antenna) 150 that transmits/receives a signal of a second frequency band (i.e., UWB frequency band of about 8 GHz).

The second antenna 150 has a higher positioning accuracy than that of the first antenna 140, but consumes relatively a lot of power. Accordingly, the smart tracker 100 minimize the power consumption by deactivating (sleeping) the second antenna 150 in case of the normal communication and activating (waking up) the second antenna only in case of the positioning.

At this time, in case of the positioning request from the parent terminal 10, the smart tracker 100 may communicate with the parent terminal 10 through the first antenna 140, but may be difficult to grasp an accurate position of the object since the positioning accuracy of the first antenna 140 becomes lower than that of the second antenna 150.

Accordingly, the smart tracker 100 communicates with the parent terminal 10 through the first antenna 140 in case of the normal communication, and communicates with the parent terminal 10 through the second antenna 150 in case of the positioning. Through this, the smart tracker 100 may minimize the power consumption as compared with the smart tracker in the related art that is composed of only the UWB antenna, and heighten the positioning accuracy as compared with the smart tracker 100 in the related art that is composed of only the BLE antenna.

Figure 2:
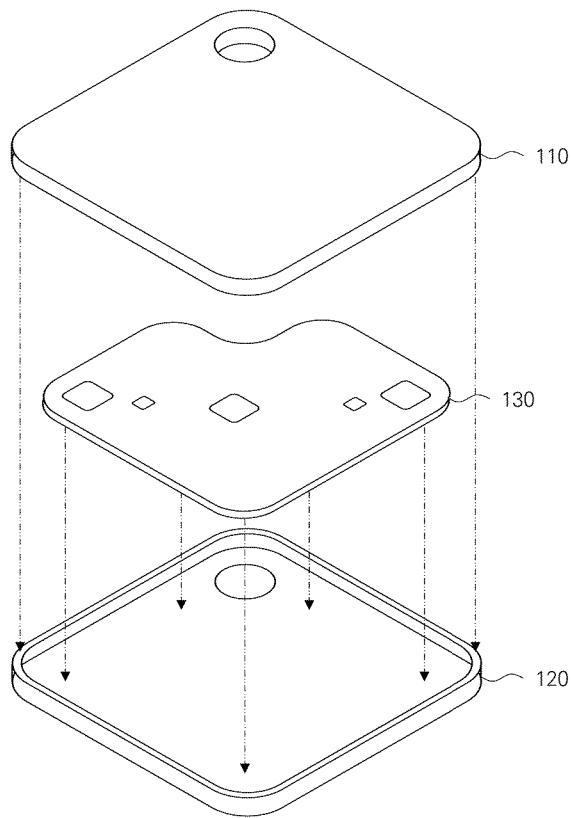
FIG. 2 is a diagram explaining the constitution of a smart tracker according to an embodiment of the present disclosure.
Figure 3:
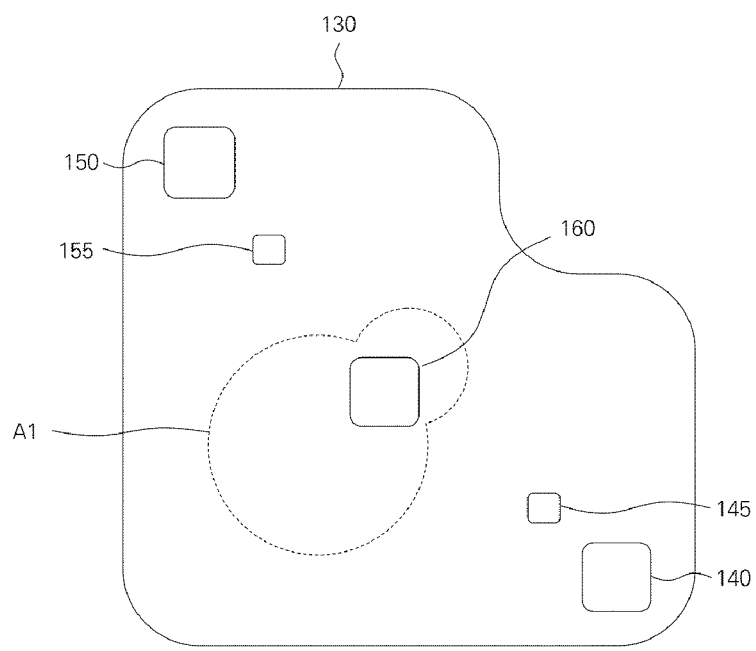
FIGS. 3 and 4 are diagrams explaining a buzzer, a battery, a first antenna, and a second antenna, being mounted on the circuit board of FIG. 2.
Figure 4:
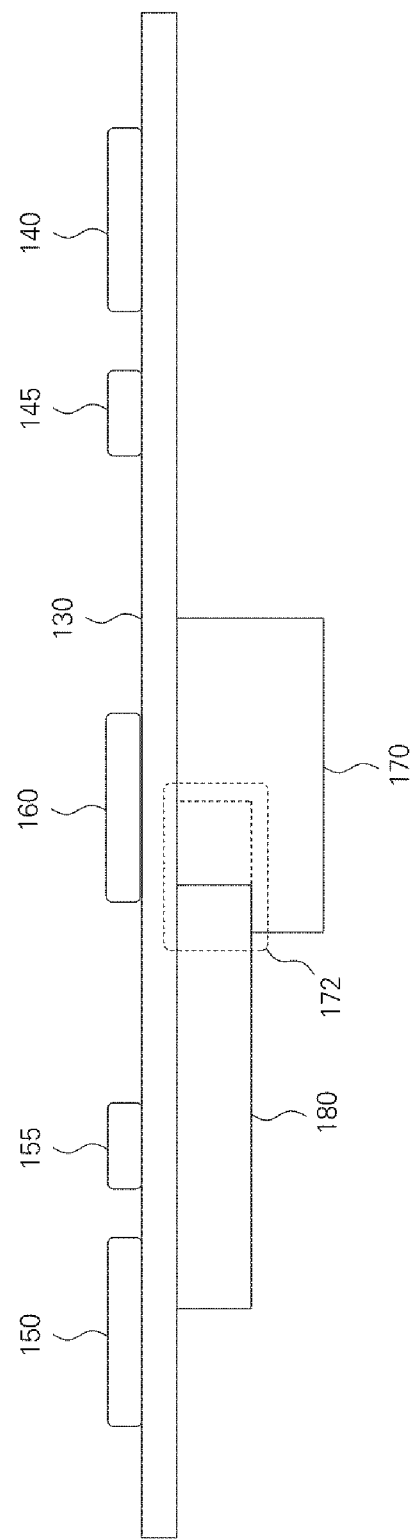

Referring to FIGS. 2 to 4, the smart tracker 100 according to an embodiment of the present disclosure is configured to include a first housing 110, a second housing 120, a circuit board 130, a first antenna 140, a second antenna 150, a buzzer 170, and a battery 180.

The first housing 110 and the second housing 120 are combined with each other to form an inner space that is a mounting space in which the circuit board 130 is mounted. In this case, inside the first housing 110 and the second housing 120, various types of structures may be formed to fix the circuit board 130.

If the first housing 110 and the second housing 120 are formed of a metal material, they shield signals being transmitted and received through the first antenna 140 and the second antenna 150, and thus they are formed of a non-metal material, such as a resin, which does not shield the signals.

The circuit board 130 is disposed in the inner space formed by the first housing 110 and the second housing 120. Various circuit elements are mounted on the circuit board 130, which include a first signal processing element 145 configured to process a first frequency signal being transmitted and received through the first antenna 140 and a second signal processing element 155 configured to process a second frequency signal being transmitted and received through the second antenna 150. A control element (MCU) 160 configured to control the operation of the smart tracker 100 is also mounted on the circuit board 130.

The first signal processing element 145 is disposed on an upper surface of the circuit board 130, and is mounted on an area where the buzzer 170 and the battery 180 are mounted and an area spaced apart from the first antenna 140 and the second antenna 150. The first signal processing element 145 processes a first signal received from the first antenna 140, and processes a signal in the Bluetooth band of about 2.5 GHz.

The second signal processing element 155 is disposed on the upper surface of the circuit board 130, and is mounted on the area where the buzzer 170 and the battery 180 are mounted and an area spaced apart from the first antenna 140, the second antenna 150, and the first signal processing element 145. The second signal processing element 155 processes a second signal received from the second antenna 150, and processes a signal in the ultra-wide band (UWB) band of about 8 GHz.

The control element 160 is mounted on the circuit board 130. The control element 160 communicates with a parent terminal 10 through the first antenna 140. The control element 160 may activate the second antenna 150 in response to a positioning request from the parent terminal 10, which is received through the first antenna, and may deactivate the second antenna 150 in response to a positioning termination request from the parent terminal 10. In other words, the control element 160 operates only in case of the positioning request from the parent terminal 10.

Figure 5:
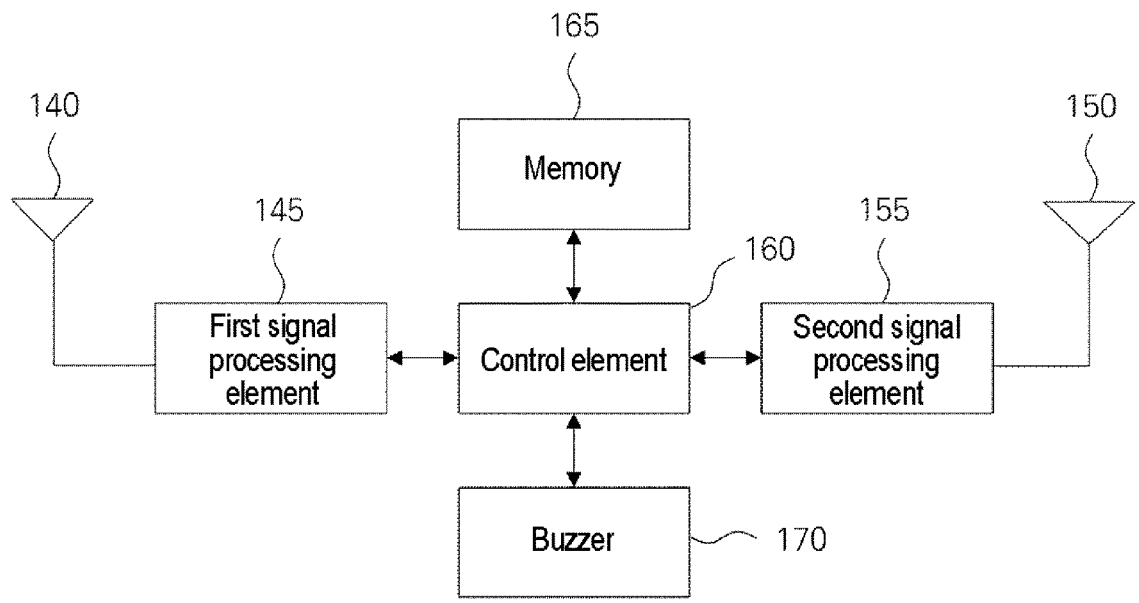
FIGS. 5 to 7 are diagrams explaining an operation of a smart tracker.
Figure 6:
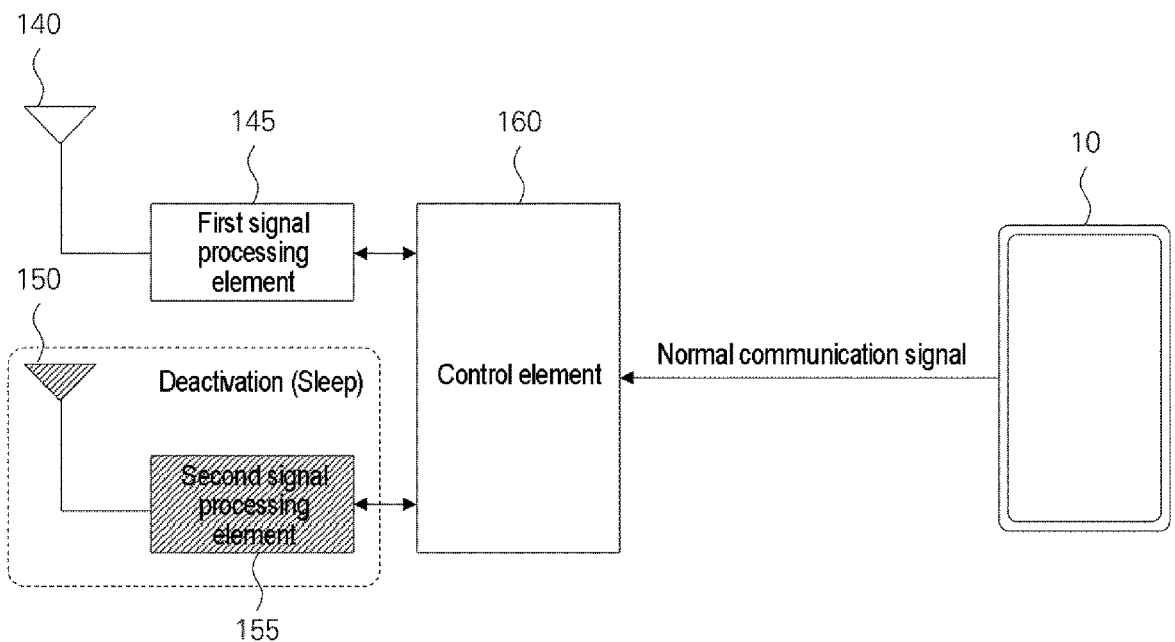

Referring to FIG. 5, the control element 160 controls the first antenna 140 to output a signal in accordance with control information stored in the memory 165. The control element 160 broadcasts the signal through the first antenna 140, and performs mutual communication with the parent terminal 10 when the communication with the parent terminal 10 is connected. In this case, referring to FIG. 6, the control element 160 controls the second antenna 150 to maintain in a deactivation state.

Figure 7:
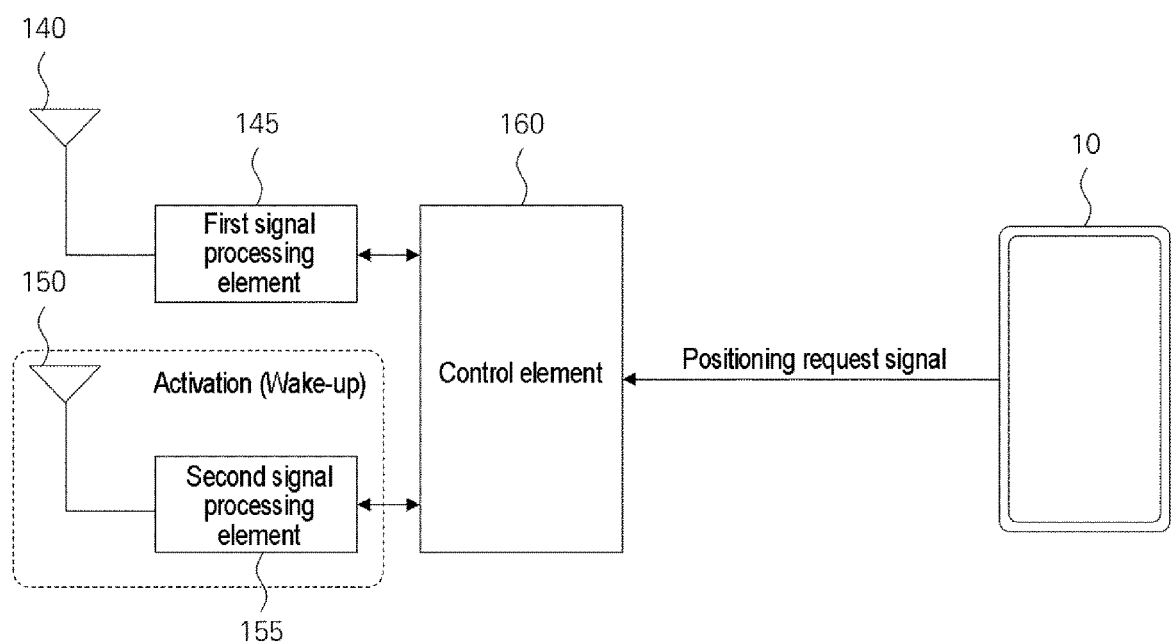

Referring to FIG. 7, if the positioning request from the parent terminal 10 is included in the signal received through the first antenna 140, the control element 160 activates the second antenna 150. The control element 160 activates the second antenna 150 in response to the positioning request from the parent terminal 10.

The circuit board 130 has a first side, a second side facing the first side, a third side connected to one end part of the first side, and a fourth side connected to the other end part of the first side and the other end part of the second side and facing the third side. In this case, the circuit board 130 has a first corner that is the position where one end part of the first side and the third side are connected to each other and a second corner that is the position where the other end part of the second side and the fourth side are connected to each other. Here, the first corner and the second corner are disposed to face each other with the center point of the circuit board 130 interposed therebetween, and the first corner and the second corner are opposite to each other in a diagonal direction with the center point of the circuit board 130 interposed therebetween.

The buzzer 170 is mounted on the lower surface of the circuit board 130. The buzzer 170 is mounted adjacent to a virtual straight line that penetrates the center point of the circuit board 130. In this case, a stepped part 172 is formed on one surface of the buzzer 170, facing the lower surface of the circuit board 130. Accordingly, between the stepped part 172 of the buzzer 170 and the lower surface of the circuit board 130, an accommodation space for accommodating at least a part of the battery 180 is formed.

The buzzer 170 outputs an alarm sound for notifying of the position of the object on which the smart tracker 100 is mounted. The buzzer 170 may output the alarm sound in response to a control signal of the control element 160, and may change the volume of the alarm sound in accordance with the distance between the parent terminal 10 and the smart tracker 100. It may be exemplified that the buzzer 170 turns down the volume of the alarm sound as the distance between the parent terminal 10 and the smart tracker 100 becomes shorter, and turns up the volume of the alarm sound as the distance between the parent terminal 10 and the smart tracker 100 becomes longer.

The battery 180 is mounted on the lower surface of the circuit board 130, and supplies an operating power to the circuit board 130. The battery 180 is mounted adjacent to the virtual straight line that penetrates the center point of the circuit board 130, and a part of the battery 180 is accommodated in the accommodation space formed between the buzzer 170 and the circuit board 130.

The first antenna 140 and the second antenna 150 are disposed on the upper surface of the circuit board 130. The first antenna 140 and the second antenna 150 are disposed to be spaced apart from each other over a predetermined distance in order to prevent the mutual interference thereof. The first antenna 140 and the second antenna 150 are disposed opposite to each other with the center point of the circuit board 130 interposed therebetween. In this case, the first antenna 140 is disposed adjacent to a first corner of the circuit board 130 by being disposed adjacent to the first side and the second side, and the second antenna 150 is disposed adjacent to a second corner of the circuit board 130 by being disposed adjacent to the third side and the fourth side.

In this case, if the size of the smart tracker 100 is increased, the first antenna 140 and the second antenna 150 may be disposed adjacent to two sides being opposite to each other. However, since the smart tracker 100 is mounted on the object, it should be miniaturized, and in this case, interference occurs between the first antenna 140 and the second antenna 150 to deteriorate the antenna performance, and thus the accuracy is degraded during positioning using the second antenna 150.

Accordingly, the first antenna 140 and the second antenna 150 are disposed to be adjacent to the two opposite corners, respectively, to maximize the spacing interval therebetween.

Meanwhile, since the antenna performance may be degraded in case that the first antenna 140 and the second antenna 150 overlap the battery 180 and/or the buzzer 170 with the circuit board 130 interposed therebetween, the first antenna 140 and the second antenna 150 are mounted on the positions spaced apart from an area overlapping the buzzer 170 and the battery 180, on the upper surface of the circuit board 130.

The first antenna 140 is an antenna for Bluetooth (BLE) communication, and outputs a BLE signal. The second antenna 150 is an antenna for ultra-wide band (UWB) communication, and operates only in case that the parent terminal 10 requests the positioning to output a UWB signal.

In this case, the parent terminal 10 may measure the position by using a received signal strength (intensity) of the BLE signal output from the first antenna 140, but this positioning may have a relatively low accuracy as compared with the positioning using a time of flight (ToF) (signal transfer time) using the UWB signal.

Accordingly, the control element 160 outputs the positioning signal through the second antenna 150. Since the power consumption of the second antenna 150 is greater than that of the first antenna 140, the control element 160 deactivates the second antenna 150 in case of the normal communication between the smart tracker 100 and the parent terminal 10, whereas the control element 160 activates the second antenna 150 in case of the positioning.

As described above, although a preferred embodiment according to the present disclosure has been described, it is understood that various modifications are possible, and those of ordinary skill in the corresponding technical field can make various modifications and correction examples without deviating from the claims of the present disclosure.

The invention claimed is:

1. A smart tracker comprising:
   a first housing;
   a second housing combined with the first housing to form an inner space;
   a circuit board disposed in the inner space formed by the first housing and the second housing;
   a buzzer mounted on a lower surface of the circuit board;
   a battery mounted on a lower surface of the circuit board;
   a first antenna disposed on an upper surface of the circuit board and spaced apart from an area on which the buzzer and the battery are mounted; and
   a second antenna disposed on the upper surface of the circuit board and spaced apart from the area on which the buzzer and the battery are mounted and the first antenna,
   wherein the buzzer includes a stepped part formed on one surface facing the lower surface of the circuit board,
   wherein the lower surface of the circuit board and the stepped part of the buzzer form an accommodation space, and at least a part of the battery is accommodated in the accommodation space, and
   wherein the antenna and the second antenna are mounted on the positions spaced apart from an area overlapping the buzzer and the battery.

2. The smart tracker of claim 1, wherein the circuit board includes a first corner and a second corner opposite to the first corner,
    wherein the first antenna is disposed adjacent to the first corner on the upper surface of the circuit board, and
    wherein the second antenna is disposed adjacent to the second corner on the upper surface of the circuit board.

3. The smart tracker of claim 1, wherein the circuit board includes a first side, a second side facing the first side, a third side connected to one end part of the first side and one end part of the second side, and a fourth side connected to the other end part of the first side and the other end part of the second side and facing the third side, and
    wherein the first antenna is disposed adjacent to the first side and the second side, and the second antenna is disposed adjacent to the third side and the fourth side.

4. The smart tracker of claim 1, further comprising:
    a first signal processing element disposed on the upper surface of the circuit board to process a first signal received from the first antenna, and spaced apart from the area on which the buzzer and the battery are mounted, the first antenna, and the second antenna; and
    a second signal processing element disposed on the upper surface of the circuit board to process a second signal received from the second antenna, and spaced apart from the area on which the buzzer and the battery are mounted, the first antenna, the second antenna, and the first signal processing element.

5. The smart tracker of claim 1, further comprising a control element mounted on the circuit board,
    wherein the control element is configured to communicate with a parent terminal through the first antenna, and
    wherein the control element is configured to activate the second antenna in response to a positioning request from the parent terminal, having been received through the first antenna, and deactivate the second antenna in response to a positioning termination request from the parent terminal.

6. The smart tracker of claim 1, wherein the first antenna is configured to resonate with a frequency of a Bluetooth communication band, and the second antenna is configured to resonate with a frequency of a UWB communication band.

* * * * *